United States Patent
Loison et al.

(10) Patent No.: US 9,574,299 B2
(45) Date of Patent: Feb. 21, 2017

(54) METHOD FOR THE TREATMENT OF SILICON CARBIDE FIBRES

(71) Applicant: HERAKLES, Le Haillan (FR)

(72) Inventors: Sylvie Loison, Saint Medard en Jalles (FR); Jean Luc Laquet, Merignac (FR); Jean Philippe Rocher, Le Haillan (FR)

(73) Assignee: HERAKLES, Le Haillan (FR)

( * ) Notice: Subject to any disclaimer, the term of this patent is extended or adjusted under 35 U.S.C. 154(b) by 231 days.

(21) Appl. No.: 14/394,127

(22) PCT Filed: Apr. 11, 2013

(86) PCT No.: PCT/FR2013/050788
§ 371 (c)(1),
(2) Date: Oct. 13, 2014

(87) PCT Pub. No.: WO2013/153336
PCT Pub. Date: Oct. 17, 2013

(65) Prior Publication Data
US 2015/0122416 A1   May 7, 2015

(30) Foreign Application Priority Data
Apr. 13, 2012  (FR) ..................... 12 53426

(51) Int. Cl.
*C04B 35/622* (2006.01)
*C04B 35/80* (2006.01)
(Continued)

(52) U.S. Cl.
CPC ............ *D06M 11/74* (2013.01); *C04B 35/565* (2013.01); *C04B 35/62281* (2013.01);
(Continued)

(58) Field of Classification Search
CPC ............. C04B 35/565; C04B 35/62281; C04B 35/626; C04B 35/62873; C04B 35/62884; C04B 35/80; C04B 35/803; C04B 35/806; C04B 41/4584; C04B 41/5353; C04B 2235/5244; C23C 16/0227; C23C 16/26; D06M 11/11; D06M 11/13; D06M 11/64; D06M 11/74; D10B 2101/16
See application file for complete search history.

(56) References Cited

U.S. PATENT DOCUMENTS 4,752,503 A   6/1988 Thebault
5,026,604 A   6/1991 Thebault
(Continued)

FOREIGN PATENT DOCUMENTS

EP   0855373 A1   7/1998
FR   2567874 A1   1/1986
(Continued)

OTHER PUBLICATIONS

International Search Report for corresponding International PCT Application No. PCT/FR2013/050788, Aug. 20, 2013.
(Continued)

Primary Examiner — Michael Tolin
(74) Attorney, Agent, or Firm — Workman Nydegger

(57) ABSTRACT

The invention relates to a method for the treatment of silicon carbide fibers, comprising a step involving the chemical treatment of fibers with an aqueous acid solution containing hydrofluoric acid and nitric acid but free of acetic acid in order to remove the silica present on the surface of fibers and to form a layer of microporous carbon. The invention also relates to a method for the production of a fibrous preform, comprising the formation of a fibrous structure comprising treated silicon carbon fibers and the use of said preform for the production of a part made from composite material.

7 Claims, 1 Drawing Sheet

(51) Int. Cl.
  *C04B 41/53* (2006.01)
  *C23C 16/02* (2006.01)
  *C23C 16/26* (2006.01)
  *D06M 11/11* (2006.01)
  *D06M 11/13* (2006.01)
  *D06M 11/64* (2006.01)
  *D06M 11/74* (2006.01)
  *C04B 35/628* (2006.01)
  *C04B 35/565* (2006.01)
  *D04H 13/00* (2006.01)

(52) U.S. Cl.
  CPC .. *C04B 35/62873* (2013.01); *C04B 35/62884* (2013.01); *C04B 35/806* (2013.01); *C04B 41/5353* (2013.01); *C23C 16/0227* (2013.01); *C23C 16/26* (2013.01); *D04H 13/001* (2013.01); *D06M 11/11* (2013.01); *D06M 11/13* (2013.01); *D06M 11/64* (2013.01); *C04B 2235/5244* (2013.01); *D10B 2101/16* (2013.01); *D10B 2401/10* (2013.01)

(56) References Cited

U.S. PATENT DOCUMENTS

| | | |
|---|---|---|
| 5,071,679 A | 12/1991 | Heraud et al. |
| 5,922,300 A * | 7/1999 | Nakajima ............ C04B 35/573 423/345 |
| 6,579,833 B1 | 6/2003 | McNallan et al. |
| 2012/0020863 A1* | 1/2012 | Plaisantin ............... C04B 35/56 423/345 |

FOREIGN PATENT DOCUMENTS

| | | |
|---|---|---|
| FR | 2640258 A1 | 6/1990 |
| WO | 2005007566 A2 | 1/2005 |
| WO | 2010076475 A1 | 7/2010 |

OTHER PUBLICATIONS

T. Hase et al. "Shrinkage of B-SiC powder treated with a mixed acid of HF and HNO3." Journal of Materials Science Letters vol. 5. 1986, pp. 69-70.

* cited by examiner

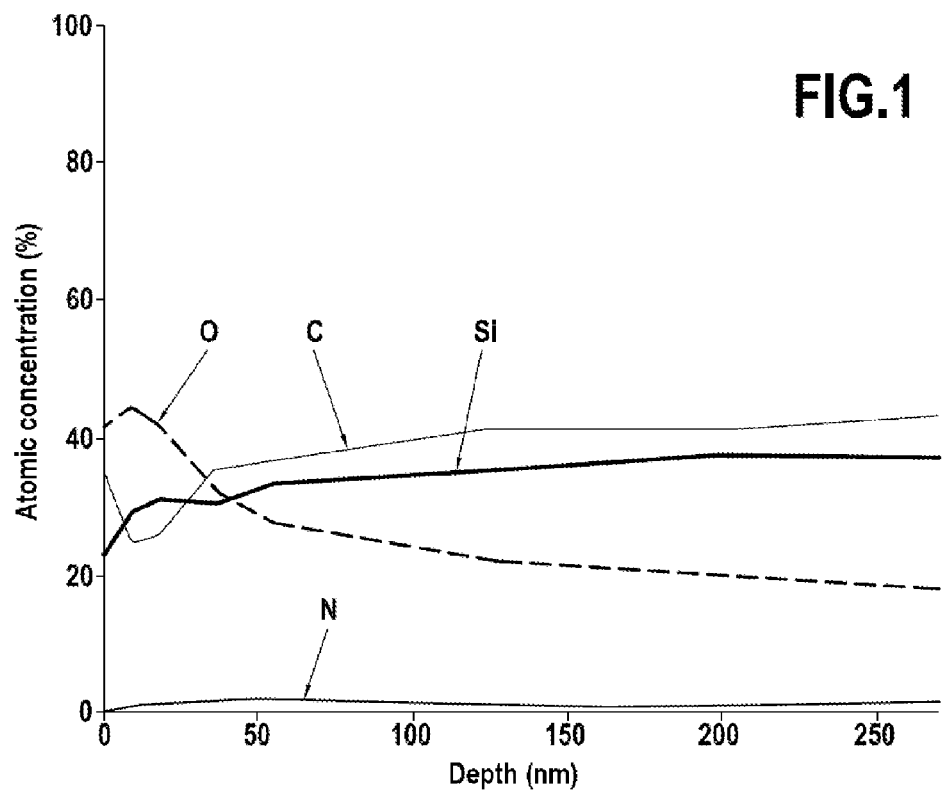
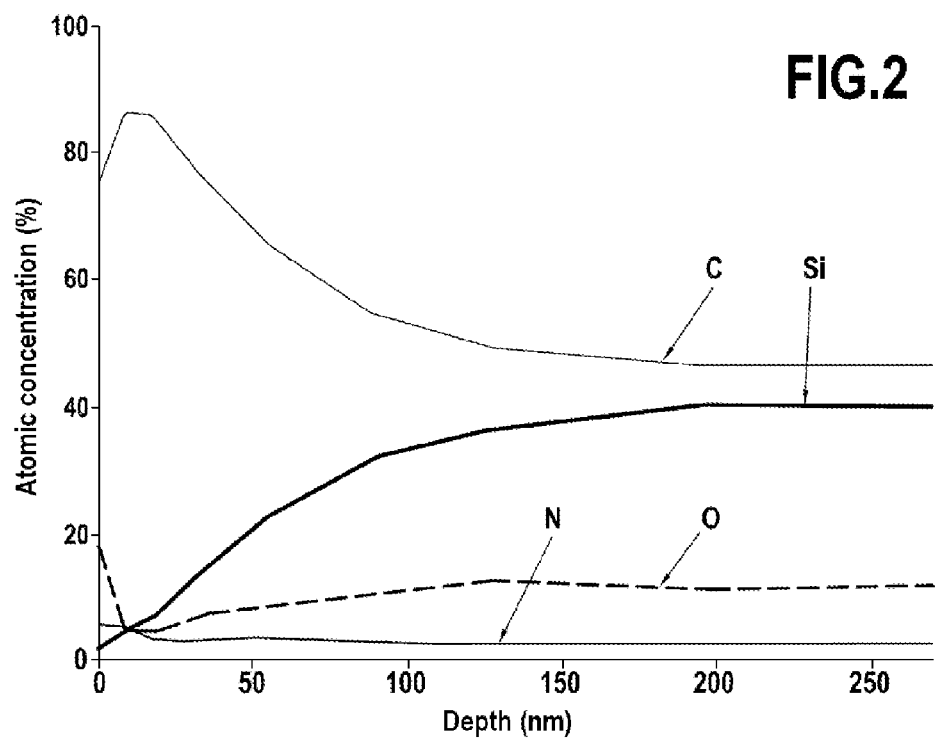

METHOD FOR THE TREATMENT OF SILICON CARBIDE FIBRES

BACKGROUND

The present invention relates to silicon carbide (SiC) fibers, used as reinforcement in the production of composite materials.

The search for good mechanical properties of composite materials, in particular at high temperatures, has led to the use of ceramic materials for fibrous reinforcement, in place of carbon which shows a limited mechanical strength and insufficient resistance to oxidation in the event of a prolonged time spent in an oxidizing medium at high temperature.

Generally, it is well known that, in composite materials comprising a fibrous reinforcement, the characteristics of the fiber-matrix interface have a great influence on the mechanical properties of the material.

In the case of composite materials comprising a ceramic matrix, it has been shown that satisfactory behavior can be obtained, in particular with respect to impacts and to the propagation of cracks, and despite the ceramic nature of the matrix, by forming on the fibers an intermediate coating of low thickness, for example made of pyrolytic carbon deposited in the vapor phase or made of boron nitride, before infiltration of the ceramic material of the matrix. Such a process is described in French patent FR 2 567 874.

However, it is advantageous to improve the bonding interface between the deposited layer of pyrolytic carbon or of boron nitride and the silicon carbide fibers. It is also advantageous to be able to have silicon carbide fibers which have reinforced mechanical properties.

It is already known that the formation of a superficial layer of microporous carbon at the surface of silicon carbide fibers has advantages in terms of improving the mechanical properties at ambient temperature (U.S. Pat. No. 6,579,833, WO 2005/007566) and constitutes, in addition, a good bonding interface with the deposited layer of pyrolytic carbon (WO 2010/076475).

However, the process described in these documents uses a reactive thermal treatment based on a halogenated gas generating a layer of microporous carbon at the surface of the carbide. This process is therefore complicated to carry out from the point of view of both the process itself and the means for carrying it out, which must be resistant to halogenated compounds.

In addition, some silicon carbide fibers have at their surface a thin layer of silica which it is advisable to remove before any subsequent treatment.

A treatment for chemical removal of the silica present at the surface of silicon carbide fibers is known from patent application FR 2 640 258. However the treatment recommended, which consists of the use either of hydrofluoric acid in solution in water, or of a solution of nitric acid in water under hot conditions, or else of a mixture of hydrofluoric acid, nitric acid and acetic acid in the precise proportions (HF 3 ml+$HNO_3$ 5 ml+$CH_3$—$CO_2H$ 3 ml) under hot conditions, which corresponds to an HF/$HNO_3$ molar ratio of 1.29, does not allow total removal of the layer of silica present at the surface of the fibers: the layer is only reduced to a thickness of about 0.005 micron, which corresponds to the limit of detection.

It would therefore be advantageous to be able to have a process which allows both the total removal of the layer of silica present at the surface of the fibers and the formation of a superficial layer of microporous carbon.

The use of hydrofluoric acid or a mixture of hydrofluoric acid and nitric acid as a solution for washing SiC fibers during the production thereof is also known, from patent application EP 0 855 373. However, this washing step is not a chemical treatment step since it serves only to remove the residues of the unreacted initial products present at the surface of the fibers after the production thereof, such as particles of silicon dioxide (or silica). It does not therefore allow the formation of a layer of microporous carbon on these fibers. In addition, this document discloses only an aqueous solution containing 46% by weight of HF mixed with an equivalent content of a solution of $HNO_3$ containing from 60% to 70% by weight of $HNO_3$. Example 2 thus discloses a mixture of 250 ml of the aqueous solution of HF with 250 ml of the solution of $HNO_3$. Thus, the acid solution of this example has a nitric acid content of between 4.76 and 5.54 mol/l and an HF content of approximately 11.5 mol/l, i.e. a hydrofluoric acid to nitric acid molar ratio of between 2.08 and 2.41. The acid concentrations described in this document are therefore so strong that it is impossible to control the reaction.

SUMMARY

The inventors have therefore surprisingly discovered that the combined use of hydrofluoric acid and nitric acid, in aqueous solution, without the addition of acetic acid, makes it possible to totally eliminate the layer of silica present at the surface of silicon carbide fibers while at the same time allowing the formation of a layer of microporous carbon, for example ≤100 nm, adhering to the fibers and having a uniform thickness. This use cannot be likened to the washing step according to patent application EP 0 855 373, since it does not take place during the production of the fibers and it is not necessary to remove the unreacted initial products present at the surface of these fibers.

Moreover, this layer of microporous carbon constitutes a good bonding interface for the deposition of a layer of pyrolytic carbon.

Indeed, in this layer, the carbon does not exhibit any particular structural organization. It is microporous and has very high specific surface areas (of about 1500 $m^2/g$) combined with very small pores (pore diameter of about 1 nanometer). In addition, if a layer of pyrolytic carbon is deposited on this layer of microporous carbon, the two layers form a mixed carbon interphase which makes it possible to increase the mechanical characteristics of the composite material, in particular with regard to tensile strengths and strain at break.

The present invention therefore relates to a process for the treatment of silicon carbide fibers, comprising the step of chemical treatment of the fibers with an aqueous acid solution containing hydrofluoric acid and nitric acid in order to remove the silica present on the surface of the fibers and to form a layer of microporous carbon, characterized in that said aqueous acid solution does not contain acetic acid.

Thus, the inventors have therefore discovered that the combined use of hydrofluoric acid and of nitric acid in aqueous solution is more advantageous than the use of each of these acids alone and than their use combined with acetic acid since it makes it possible to totally remove the silica present at the surface of the fibers and to form a layer of microporous carbon of less than or equal to 100 nm. There is therefore a synergy in the combined use of HF and $HNO_3$ which was not at all suggested in the prior art. Indeed, HF removes the silica present at the surface of the fibers and $HNO_3$ makes the silica soluble and oxidizes the silicon carbide and oxycarbide of the fiber so as to allow the creation of the layer of microporous carbon. If HF is used alone, not all the silica may be removed if its chemical form is not soluble, and no layer of microporous carbon is present at the surface of the fibers. If, on the other hand, $HNO_3$ is used alone, there will be no removal of the silica and therefore the oxidation will not be able to take place, nor will the creation of the layer of microporous carbon. The combined use of these two acids is therefore essential for carrying out the invention. In addition, it has been surprisingly discovered that, contrary to what was suggested in the prior art, acetic acid has no impact on the silica covering the fibers and that the presence of this acid in the aqueous acid solution during the chemical treatment step is therefore needless.

Advantageously, this process is not carried out during the process for producing the fibers or as a washing step of this process, i.e. on fibers which have, on their surface, unreacted initial products, for instance silicon dioxide particles. The process according to the invention does not therefore serve as a simple fiber washing step, but allows the formation of a layer of microporous carbon at the surface of the fibers.

The acid ratio that can be used in the context of the present invention depends on the desired thickness of the layer of microporous carbon, on the type of fibers to which the treatment is applied (carbide to oxycarbide ratio and types of carbides) and on the temperature of the treatment. In one particular embodiment of the present invention, in particular at a temperature of 20° C., the aqueous acid solution according to the invention contains a hydrofluoric acid/nitric acid molar ratio of less than 1.5, advantageously less than 1.2, even more advantageously less than 1, even more advantageously less than 0.8, in particular greater than 0.1, advantageously greater than 0.15, even more advantageously greater than 0.2.

Generally, it is advantageous for the acid solutions not to be too concentrated in order to be able to manage controllable attack kinetics and therefore good reproducibility of the carbon layer formed.

Advantageously, the aqueous acid solution according to the invention contains, at 20° C., a nitric acid content of between 0.5 and 5 mol/l, advantageously between 2 and 5 mol/l, in particular between 0.5 and 4 mol/l, particularly between 2 and 4 mol/l.

This is because above 5 mol/l, there is a risk of the $HNO_3$ molecules sterically blocking the access of HF to the surface of the fibers, which could go as far as preventing the reaction from taking place. On the other hand, it is necessary to have a minimum amount of $HNO_3$ present, in order to initiate the reaction.

Advantageously, the aqueous acid solution according to the invention contains, at 20° C., a hydrofluoric acid content of between 0.5 and 4 mol/l, advantageously between 0.5 and 3 mol/l, in particular between 0.5 and 2.5 mol/l, more particularly between 0.5 and 2 mol/l.

The amount of HF determines the reaction kinetics for a given $HNO_3$ concentration.

In another particular embodiment of the present invention, the chemical treatment step is carried out at ambient temperature, i.e. between 20 and 25° C. It is not therefore carried out under hot conditions, contrary to what is recommended in patent application FR 2 640 258 when nitric acid is present. The duration of the chemical treatment step depends on the thickness of the layer of microporous carbon that it is desired to obtain at the surface of the fiber and on the HF/HNO3 ratio used. Advantageously, this step lasts between 10 minutes and 5 hours, advantageously between 3 and 5 hours in order to obtain a layer of less than or equal to 100 nm.

In yet another embodiment of the present invention, the chemical treatment step is carried out under hot conditions, i.e. at a temperature above ambient temperature, in particular at approximately 30° C. The duration of the chemical treatment step can, in this case, be shorter than at ambient temperature. In the case where the temperature of the chemical treatment is approximately 30° C., this step lasts between 10 minutes and 3 hours, advantageously between 10 minutes and 2 hours in order to obtain a layer of less than or equal to 100 nm.

In yet another embodiment of the present invention, the chemical treatment step is carried out under cold conditions, i.e. at a temperature below ambient temperature, in particular at approximately 10° C. In the case where the temperature of the chemical treatment is approximately 30° C., this step lasts between 2 hours and 8 hours, advantageously between 2 hours and 6 hours in order to obtain a layer of less than or equal to 100 nm.

In particular, the chemical treatment according to the present invention is carried out by immersing the fibers in an aqueous acid solution according to the present invention for the time necessary for the elimination of the superficial layer of silica and for the formation of the layer of microporous carbon. Advantageously, the aqueous acid solution according to the invention contains only water and the acids HF and $HNO_3$. After this treatment, the process according to the present invention may comprise a step of rinsing with water and of drying the treated fibers obtained. This makes it possible to remove all residual traces of acid solution used in the process according to the present invention.

Advantageously, the silicon carbide fibers obtained following the treatment according to the present invention have a superficial layer of microporous carbon ≤100 nm, advantageously of approximately 50 nm. Even more advantageously, the superficial layer of silica present on the untreated fibers has disappeared. Indeed, before treatment, the fibers are covered with silica over a variable thickness, the average of which is approximately equal to 0.3 micron. By virtue of the treatment according to the present invention, this layer has totally disappeared.

The fibers treated by means of the process according to the present invention can have any form, for example yarns, roves, strands, cables, fabrics, felts, braids, mats, and even two-dimensional or three-dimensional preform. They are in particular Nicalon® fibers commercially available from the company Nippon Carbon Co. They may also be Tyranno® fibers from UBE Industries.

In one additional embodiment of the present invention, the fibers to be treated are covered with a sizing which is not removable by chemical treatment, and the process according to the present invention comprises the prior step of virtually completely removing said sizing, advantageously by heat treatment. This is because, although the aqueous acid solution according to the invention causes partial dissolution of a polyvinyl alcohol-based sizing, it has no effect on the vinyl acetate sizing which may also cover certain silicon carbide fibers. In the latter case, and in order for it to be possible for the subsequent treatment with the aqueous acid solution according to the invention to be totally effective, it is therefore preferable to remove the vinyl acetate sizing beforehand. To do this, the SiC fibers can be subjected to a thermal desizing treatment (this technique being more effective than chemical desizing, which can also be used). The SiC fibers are, for example, brought to a temperature of 600° C. in air for 20 seconds. The use of a relatively moderate temperature for a very short period of time avoids any notable oxidation of the silicon carbide.

Advantageously, the fibers to be treated by means of the process according to the present invention do not exhibit on their surface any residues of the initial products having been used to produce them, for instance silica dioxide particles.

In another embodiment of the present invention, the process according to the invention comprises the additional step of depositing a layer of pyrolytic carbon on the silicon carbide fibers treated by means of the process according to the present invention. This depositing can be carried out by techniques well known to those skilled in the art, for example as described in patent application FR 2 567 874. This depositing therefore takes place directly on the layer of microporous carbon.

The present invention also relates to a process for the production of a fibrous preform, comprising the formation of a fibrous structure based on silicon carbide fibers, the fibers having been treated in accordance with the treatment process according to the present invention.

The forming of the preform can be carried out by winding, weaving, stacking, and optionally needling of two-dimensional strata of fabric or of plies of cables containing the silicon carbide fibers, etc.

In a first advantageous embodiment, the fibers are treated before the formation of the fibrous structure. Thus, after the treatment of the fibers according to the present invention, the fibers are used for the production of a fibrous preform of parts made from composite materials.

In a second advantageous embodiment, the fibers are treated after the formation of the fibrous structure.

Thus, for example in the latter case, it is the fibrous structure which is directly immersed in the bath containing the aqueous acid solution according to the present invention.

Finally, the present invention relates to a process for the production of a part made from composite material, comprising the production of a fibrous preform in accordance with the process according to the invention and the densification of said preform.

The production of parts made from composite material reinforced with silicon carbide fibers is well known. It generally comprises the production of a ceramic fibrous preform, the shape of which is close to that of the part to be produced, and the densification of the preform using a matrix. The fibrous preform constitutes the reinforcement of the part, the role of which is essential with respect to the mechanical properties.

The densification of the fibrous reinforcement can be carried out by the liquid process (impregnation with a precursor resin of the matrix and transformation by cross-linking and pyrolysis, the process possibly being repeated) or via the gaseous process (chemical vapor infiltration of the matrix). The invention applies in particular to the production of parts made from composite material comprising a matrix which is at least partly ceramic, and advantageously comprising a totally ceramic matrix (CMCs), formed by a fibrous reinforcement made from silicon carbide fibers, densified by a matrix which is at least partly ceramic or totally ceramic, in particular carbide, nitride, refractory oxides, etc. Typical examples of such CMC materials comprising silicon carbide fibers are SiC—SiC materials (silicon carbide fiber reinforcement and silicon carbide matrix).

BRIEF DESCRIPTION OF THE DRAWINGS

The invention will be understood more clearly in the light of the figures and examples which follow.

FIG. 1 represents the atomic concentration of silicon, carbon, nitrogen and oxygen (as %) as a function of the depth (in nm) inside the fiber before treatment (zero corresponds to the surface of the fiber).

FIG. 2 represents the atomic concentration of silicon, carbon, nitrogen and oxygen (as %) as a function of the thickness of the fiber after treatment according to the invention (zero corresponds to the surface of the fiber).

DETAILED DESCRIPTION OF VARIOUS EMBODIMENTS

Example 1

The process in accordance with the invention was carried out on fibrous textures, and more particularly fabrics made from SiC fibers produced by the Japanese company Nippon Carbon Co. Ltd using a treatment for removal of silica and formation of a layer of microporous carbon by dipping the textures in a bath containing an aqueous solution of hydrofluoric acid (0.7 mol/l) and of nitric acid (3 mol/l) for four hours at ambient temperature.

The fibrous textures obtained are then rinsed with water and dried.

Before this treatment, desizing of the fibrous textures is carried out via the thermal process. The SiC fibers are brought to a temperature of 600° C. in air for 20 seconds.

Comparing FIG. 1 and FIG. 2 attached hereto, it should be noted that the silica has disappeared from the surface of the fibers treated by means of the process according to the invention and has been replaced with a layer of microporous carbon.

Comparative Example 2

The process in accordance with patent application FR 2 640 258 was carried out on fibrous textures, and more particularly fabrics made from SiC fibers produced by the Japanese company Nippon Carbon Co. Ltd using a treatment for removal of silica by dipping the textures in a bath containing an aqueous solution of hydrofluoric acid (at a concentration of between approximately 20 and 30 mol %) for approximately one hour at ambient temperature.

The fibrous textures obtained are then rinsed with water and dried. Before this treatment, desizing of the fibrous textures is carried out by the thermal process, for example at 600° C. in air for 20 seconds.

The fibers before treatment are covered with silica on an average thickness of approximately 0.3 micron. After this treatment, this thickness is reduced to approximately 0.005 micron and no trace of microporous carbon is present at the surface of the fibers.

Example 3

The same process as in Example 1 is carried out, with the exception of the fact that the bath contains an aqueous solution of hydrofluoric acid at 2.3 mol/l and of nitric acid at 4 mol/l, that the treatment time is 75 minutes and that the treatment temperature is 30° C.

The thickness of the layer of microporous carbon obtained at the surface of the fibers is 215 nm.

Example 4

The same process as in Example 1 is carried out, with the exception of the fact that the treatment time is 30 minutes and that the treatment temperature is 30° C.

The thickness of the layer of microporous carbon obtained at the surface of the fibers is 30 nm.

Example 5

The same process as in Example 1 is carried out, with the exception of the fact that the treatment time is 120 minutes and that the treatment temperature is 30° C.

The thickness of the layer of microporous carbon obtained at the surface of the fibers is 100-90 nm.

Example 6

The same process as in Example 1 is carried out, with the exception of the fact that the treatment time is 480 minutes and that the treatment temperature is 10° C.

The thickness of the layer of microporous carbon obtained at the surface of the fibers is at most 70 nm.

The invention claimed is:

1. A process for the treatment of silicon carbide fibers, comprising the step of chemical treatment of the fibers with an aqueous acid solution containing hydrofluoric acid and nitric acid in order to remove the silica present at the surface of the fibers and to form a layer of microporous carbon, wherein said aqueous acid solution does not contain acetic acid and wherein the aqueous acid solution contains a hydrofluoric acid content of between 0.5 and 4 mol/l.

2. The process as claimed in claim 1, wherein the aqueous acid solution contains a hydrofluoric acid/nitric acid molar ratio of less than 1.5.

3. The process as claimed in claim 1, wherein the aqueous acid solution contains a nitric acid content of between 0.5 and 5 mol/l.

4. The process as claimed in claim 1, wherein the chemical treatment step is carried out at ambient temperature and lasts four hours.

5. The process as claimed in claim 1, wherein the fibers obtained have a superficial layer of microporous carbon ≤100 nm.

6. The process as claimed claim 1, wherein the fibers are covered with a sizing not removable by chemical treatment, and in that the process comprises the prior step of virtually completely removing said sizing by heat treatment.

7. The process as claimed in claim 1, wherein it comprises the additional step of depositing a layer of pyrolytic carbon on the silicon carbon fibers treated.

* * * * *